United States Patent
Fletcher et al.

(10) Patent No.: US 6,977,601 B1
(45) Date of Patent: Dec. 20, 2005

(54) LOW POWER CURRENT INPUT DELTA-SIGMA ADC USING INJECTION FET REFERENCE

(75) Inventors: Christopher L. Fletcher, Santa Barbara, CA (US); Martins Skele, Langley, WA (US)

(73) Assignee: Raytheon Company, Waltham, MA (US)

( * ) Notice: Subject to any disclaimer, the term of this patent is extended or adjusted under 35 U.S.C. 154(b) by 72 days.

(21) Appl. No.: 10/769,111

(22) Filed: Jan. 29, 2004

(51) Int. Cl.[7] .............................................. H03M 3/00
(52) U.S. Cl. .................................................... 341/143
(58) Field of Search ............................... 341/155, 143, 341/133, 136, 134; 327/336, 345

(56) References Cited

U.S. PATENT DOCUMENTS

| | | | | |
|---|---|---|---|---|
| 4,338,530 A | * | 7/1982 | Six et al. ..................... | 327/558 |
| 5,303,027 A | * | 4/1994 | Kuderer et al. ............. | 356/328 |
| 5,550,498 A | * | 8/1996 | Kwan et al. ................. | 327/175 |
| 6,018,200 A | * | 1/2000 | Anderson et al. ........... | 290/40 B |
| 6,201,426 B1 | * | 3/2001 | Sumiyoshi et al. ......... | 327/291 |

* cited by examiner

*Primary Examiner*—Peguy JeanPierre
(74) *Attorney, Agent, or Firm*—William C. Schubert; Karl A. Vick

(57) ABSTRACT

A low power delta-sigma analog to digital converter 10 for converting current mode signals without an amplifier includes an integration capacitor 26, a comparator 30, and a first switch 24 in parallel with one another and coupled to an integration node 28. A FET 20 and the first switch are disposed in series between a dump capacitor 25 and the integration node. A second switch 27 operates to discharge the dump capacitor, and an output of the comparator controls both switches in opposition. Preferably, no op-amps are included in the circuit, and current is supplied by an imaging component 5. In a first comparator state, the first capacitor charges, the first switch is open and the second switch is closed, and the dump capacitor discharges. In a comparator second state, the first switch is closed and the second switch is open, and the integration capacitor transfers a fixed amount of charge into the dump capacitor through an injection FET operating in saturation.

13 Claims, 6 Drawing Sheets

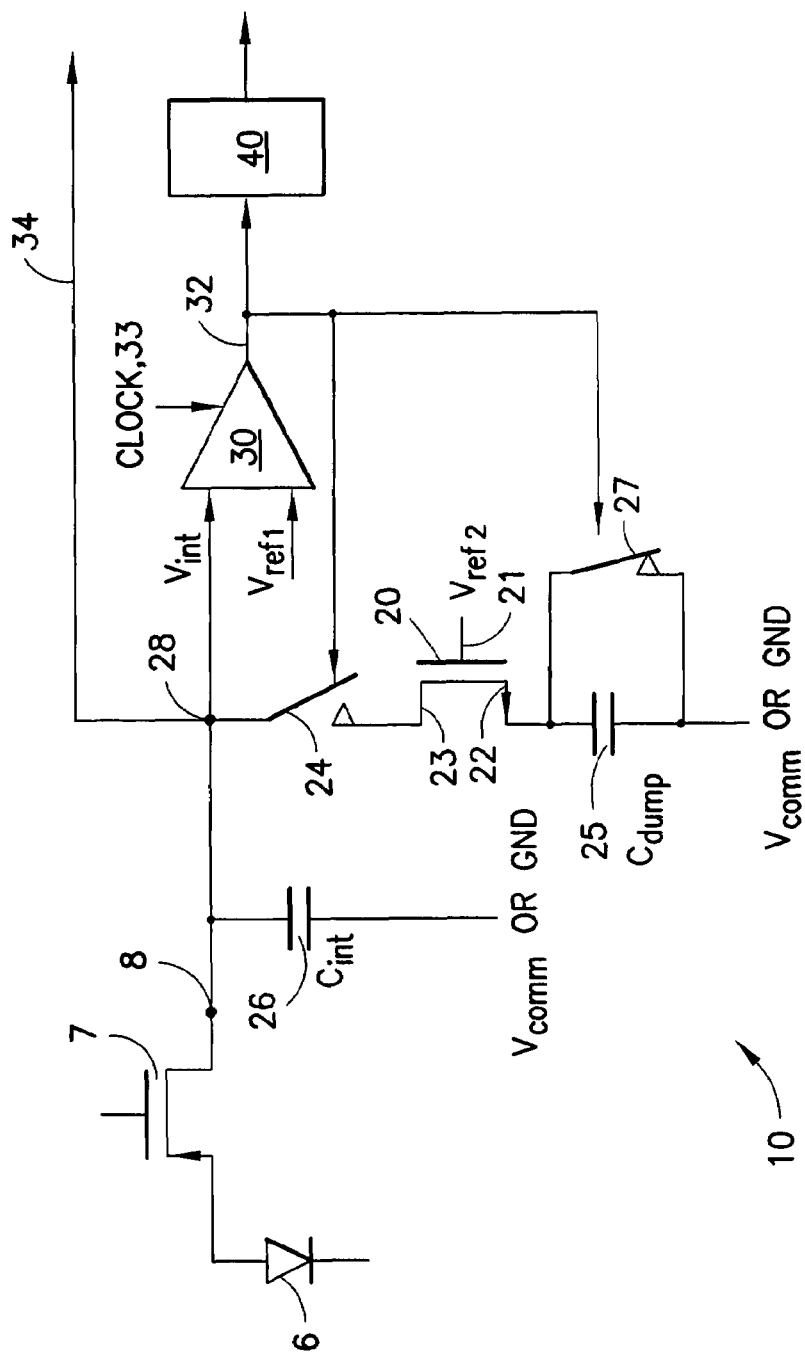
FIG. 3A  $V_{int} < V_{ref1}$ $V_{int} > V_{ref1}$

LOW POWER CURRENT INPUT DELTA-SIGMA ADC USING INJECTION FET REFERENCE

STATEMENT REGARDING FEDERALLY SPONSORED RESEARCH OR DEVELOPMENT

This invention was made with Government support under contract No. N66001-02-C-8078 awarded by the Department of the Navy. The Government has certain rights in this invention.

TECHNICAL FIELD OF THE INVENTION

The teachings herein relate to a low power delta-sigma analog to digital converter (ADC) that is particularly advantageous for use with sensors of an array.

BACKGROUND OF THE INVENTION

Delta-Sigma analog to digital converters (ADCs) work by integrating (the Sigma) the difference (the Delta) between an input signal and an output value. The integrator is embedded in a feedback loop in such a way that the difference is driven to zero, making the output (a digital bit stream or word) equal in value to the input, which is a voltage or current. Hypothetically, for an ideal integrator, the delta would be precisely zero after settling. Typically, the integration is performed by an operational amplifier and a capacitor. Since the output is a digital value, it must be converted back to an electrical signal before it can be subtracted from the input to form the Delta. Usually, the output value is approximated by connecting a known reference to the input for some percentage of the time depending on the output bit stream. The average value of the reference multiplied by the duty cycle is driven to be equal to the input signal. The bit stream is then digitally filtered and down-sampled to produce the digital output word. Delta-sigma ADCs have a variety of uses, including in calibration equipment, meters, wireless communications audio equipment, and with imaging arrays.

One example of basic architecture for a delta-sigma ADC is provided in FIG. 1 (prior art). The ADC of FIG. 1 is a first order delta-sigma ADC and includes a count and dump decimator, and is not configured to take advantage of the unipolar input. Note that the switch allows the reference value to be sent either to the sum or to the difference port of the summing function, enabling the circuit of FIG. 1 to follow both positive and negative signal inputs. Some of the advantages of this design include having a 20-bit capable ADC, without a requirement for a secondary ADC. However, this design typically requires a large counter that must be present in each ADC. Further, for a given frame time, the maximum signal to noise ratio (SNR) is constrained by the pixel area, clock frequency, and power limitations.

There are two main reasons for using the type of ADC described above. First, a very precise delta-sigma ADC may be fabricated without using precision components. Second, a delta-sigma ADC can contain the signal within a limited bias range despite a large input dynamic range. One difficulty with prior art designs is that they generally employ an amplifier that consumes too much power for use in a large imaging array, such as an array of infrared detectors.

One attempt to improve the basic architecture is depicted in FIG. 2, which illustrates a "residue-readout" ADC (sometimes referred to as an "Eden" ADC) derived from a first order delta-sigma ADC. At the right of the drawing is a necessary auxiliary ADC. The main advantage of the ADC of FIG. 2 over a conventional one is the presence of a residue readout, which enables the use of a smaller counter for a given SNR requirement. The resolution of the over-all ADC can be set higher than permitted by the length of the counter because the residue information can be used to refine the digital output word. The auxiliary residue readout feature permits the residue-readout ADC to be operated as a delta-sigma ADC or a folding ADC. The residue-readout ADC takes advantage of the unipolar signal provided by image detectors by replacing the adding and subtracting of the reference seen in FIG. 1 with a single charge dump capacitor.

In the residue-readout ADC, the charge dump portion provides a constant delta-Q that provides for decrement of the integration capacitor by a known amount. The bottom of the dump capacitor may be connected to a special reference voltage, but ground can be used when layout constraints exist. As in all switched capacitor circuits, the switches provide a path for clock feed through, which appears as input offset current in the output digital word. Non-overlapping clock phases must be used. Further, noise is captured at the end of every charge dump event but auxiliary ADC quantization noise is the largest noise contribution.

While the residue-readout ADC does not require 20-bits in the cell (unlike conventional ADCs), it requires the noted auxiliary ADC and provides poor power per pixel when used in an imaging array. Sample and hold buffers are required for each pixel to provide the signal to the auxiliary ADC. Performance is limited by pixel array constraints, and implementation details. Often, the maximum signal to noise ratio (SNR) is constrained by residue read-out and the pixel area.

Ongoing research into focal plane arrays, such as infrared focal plane arrays (IR FPAs), has included embedded ADCs. Many implementations attempted have involved placement of an ADC on the column of the read-out integrated circuit (ROIC). At least one attempt has involved an effort to fit a high dynamic range ADC to every detector in an IR FPA. However, these implementations each require significant power to achieve the bandwidth for use in an imaging array. What is needed is a low power delta-sigma ADC, such as one that may be used in a large imaging array.

SUMMARY OF THE INVENTION

The foregoing and other problems are overcome by methods and apparatus in accordance with embodiments of this invention. Therefore, it is considered that the embodiments provided herein are illustrative only, and are not to be considered limiting of the invention.

An apparatus according to the invention includes a circuit having two capacitors, two switches, a transistor, and a comparator. The circuit is best described with reference to a node termed an integration node. One capacitor is termed an integration capacitor and is coupled to the integration node. The comparator has a first input coupled to the integration node and a second input coupled to a first reference voltage $V_{ref1}$ that is preferably supplied externally and independent of the voltage within the circuit deriving from an input signal. The second capacitor is termed a dump capacitor, and has a first node and a second node. The transistor has a first node, preferably the drain, coupled through a first switch to the integration node. An opposed second node, preferably the source of the transistor, is coupled to the first node of the dump capacitor. The third node, the gate, is coupled to an externally supplied reference voltage $V_{ref2}$. The second switch is disposed across the dump capacitor. Both the first and second switches are controlled by an output of the comparator.

In another aspect of the invention is a readout circuit. The readout circuit includes an input node for receiving a photocurrent generated by a radiation detector. The photocurrent represents the analog signal to be converted by the readout circuit, and refers to any current signal output by the various types of radiation detectors. The circuit further includes an integrating capacitor having a first node coupled to the input node, and a comparator. A first comparator input is coupled to the first node of the integrating capacitor and a second comparator input is coupled to a first reference signal. The circuit further includes an injection field effect transistor FET having a gate coupled to a second reference signal. The injection FET is coupled between the first node of the integrating capacitor and a node of a dump capacitor. A first switch is disposed between the injection FET and the first node of the integrating capacitor. A second switch is disposed across the dump capacitor. An output of the comparator is coupled to the first and second switches for controlling the position of the switches based on the state of the comparator. In the preferred embodiment, he two switches are operated in opposition so that both are never closed at the same time.

The present invention additionally includes a method for converting an analog signal to a digital signal. The method includes inputting an analog current signal to an input node and comparing an electrical parameter at an integration node to a reference electrical parameter. The input node and the integration node are in series with one another. In a first comparator state, preferably where the parameter at the integration node is less than the reference parameter, the method includes charging a capacitor from the input node which accomplishes the integration. In a second comparator state, preferably where the parameter at the integration node is greater than the reference parameter, that charge stored on the capacitor is decremented, preferably by a fixed and precise amount into a dump capacitor via an injection FET. The charge decrement accomplishes the subtraction. In the preferred embodiment, the parameter is voltage so that after the decrement, voltage at the integration node is once again lower than the reference, and the comparator state reverts to the first state on the next clock edge. By counting the number of decrements, the analog signal is converted to digital. Counting the comparator state changes from first to second, from second to first, or both are each included within the term counting the number of decrements.

Other variations are disclosed that provide additional details that may remain within one or more particular embodiments. Further variations may become evident to those of ordinary skill in the art without departing from the described principles and claimed invention.

BRIEF DESCRIPTION OF THE DRAWINGS

The above set forth and other features of the invention are made more apparent in the ensuing Detailed Description of the Invention when read in conjunction with the attached Drawings, wherein:

FIG. 3A depicts a block diagram of a delta-sigma ADC with switches in one position according to the teachings herein;

DETAILED DESCRIPTION OF THE INVENTION

Figure 1:
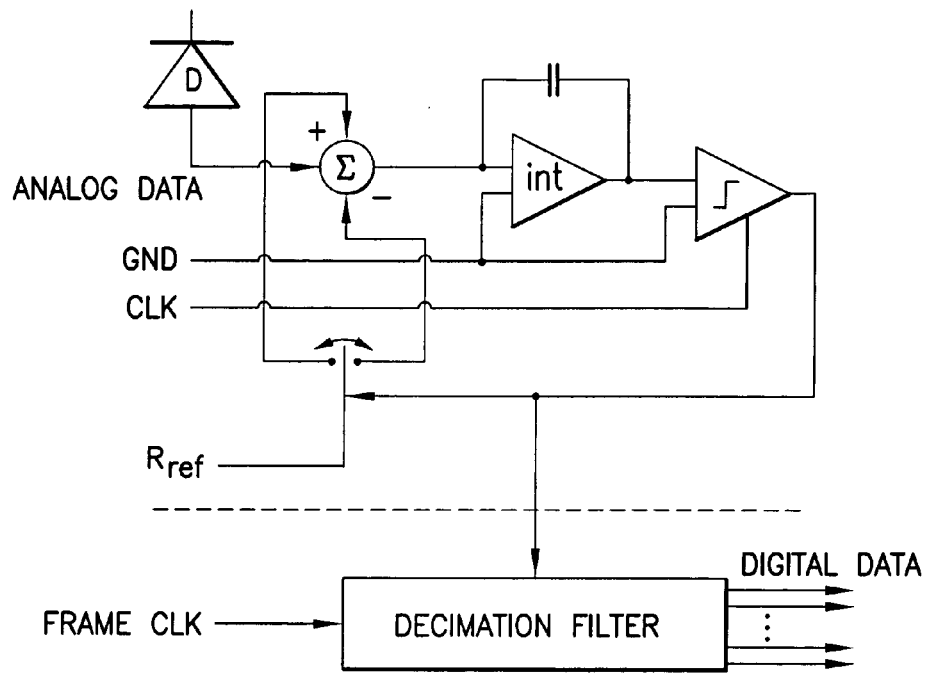
FIG. 1 depicts the basic architecture of a prior art delta-sigma ADC.
Figure 2:
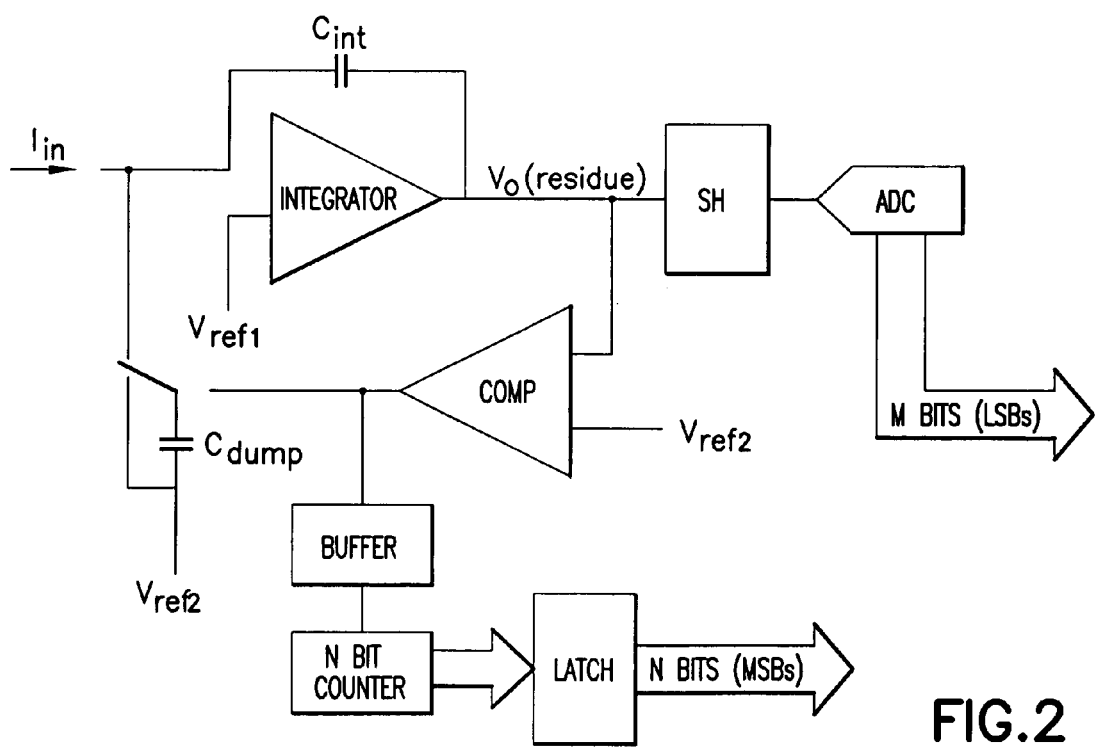
FIG. 2 depicts a prior art enhancement to the basic architecture, referred to as the residue-readout ADC.
Figure 3B:
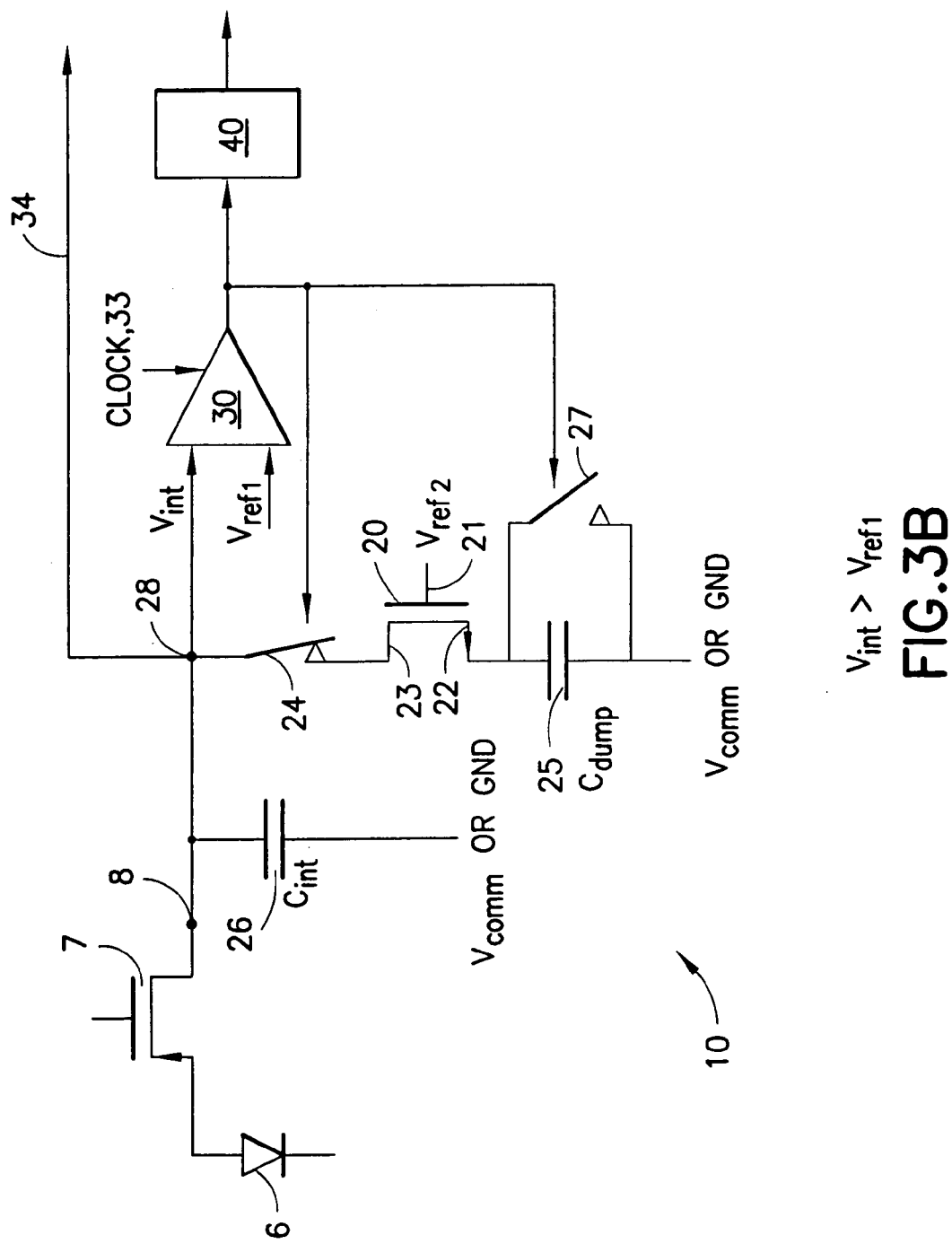
FIG. 3B depicts the circuit of FIG. 3A with switches in an opposed position.

Disclosed herein is a low power delta-sigma ADC, such as one that may be used in a large imaging array. An exemplary embodiment is depicted in FIGS. 3A–B. A low power delta-sigma ADC 10 is connected by a protection FET 7 or other protection circuitry to imaging components, represented as a diode 6. An input node 8 is a point at which current from the imaging components or other such radiation detectors enters the circuit 10 substantially unchanged by the circuit 10. Imaging components 6 such as cells of an array to be described below provide an electrical signal through the protection FET 7 to the input node 8.

An integration node 28 is coupled in series with the input node 8. An integrating capacitor 26, a first switch 24, and a comparator 30 are each connected in parallel to the integration node 28. The first switch 24 is disposed between the integration node 28 and a transistor 20, herein termed an injection field effect transistor (FET) 20. The injection FET 20 includes a source 22, a drain 23, and a gate 21, and in the preferred embodiment the drain 23 is adjacent to the first switch 24. The gate 21 is connected to a second reference voltage $V_{ref2}$ that is external to the circuit. The injection FET 20 may include more than one gate 21.

A dump capacitor $C_{dump}$ 25 is coupled to the side of the injection FET 20 opposite the first switch 24. This arrangement allows the injection FET 20 and the second reference voltage $V_{ref2}$ to control charge transferred to the dump capacitor 25. The second switch 27 operates across the dump capacitor 27 so that when the second switch 27 is closed, the dump capacitor 25 discharges. The second switch 27 is coupled at one side to a node disposed between the dump capacitor 25 and the injection FET 20, and at the other side to a node on the opposing side or plate of the dump capacitor 25. Each of the integrating capacitor 26 and the dump capacitor 25 are shown as coupled to a common potential $V_{comm}$, which may or may not be ground. In certain embodiments the common potential $V_{comm}$ may differ between the integrating 26 and dump 25 capacitors.

The comparator 30 defines two stable states based on a comparison of two inputs. The inputs are preferably voltage, but may alternatively be another electrical parameter for other types of comparators known in the art. The comparator inputs are voltage $V_{int}$ at the integration node 28 and a first reference voltage $V_{ref1}$, and when one input exceeds the other, the comparator 30 changes states on the following clock edge determined by the clock input 33. The comparator output 32 operates to control the first 24 and second 27 switches such that one is open and the other is closed in one comparator state, and vice versa for the other comparator state. The one comparator state is shown in FIG. 3A, wherein $V_{ref1}$ is greater than $V_{int}$. The other comparator state is shown in FIG. 3B, wherein $V_{int}$ is greater than $V_{ref1}$.

Preferably, the ADC 10 makes use of other known components, such as a counter 40 and a residue readout 34. A counter 40 preferably operates on one state change for simplicity (e.g., every other state change, such as the first clock edge following the condition $V_{int}$ greater than $V_{ref1}$). However, the present invention includes both a counter that counts both state changes and two counters that each count opposing state changes. The residue readout is for outputting values of the voltage $V_{int}$ at the integrating node 28, since voltage at that node is proportional to the integral of the input signal, which is the value that will be used later to refine the digital output word.

The input signal from the imaging components 6 provides a current to the input node 8 that allows the integrating capacitor 26 to collect charge. As charge builds within the integrating capacitor 26, voltage at the integration node 28 rises. Without the action of comparator 30 working through the switches 24 and 27 and injection FET 20, the voltage on the integration node 28 would rise until the drain of the input protection FET 7 is no longer able to supply any more current to the capacitor. The components comprising FIGS. 3A–B are arranged in such a way that they act to maintain the voltage $V_{int}$ at the integration node 28 within a range to avoid that and to keep the circuit functioning properly.

In a first comparator state depicted in FIG. 3A, the first switch 24 is open and the second switch 27 is closed. In this state, the integrating capacitor 26 is charging and the voltage at the integration node 28 is rising, but $V_{int}$ has not yet exceeded $V_{ref1}$ at the comparator 30. The injection FET 20 is not conducting since the first switch 24 is open. The second switch 27 is closed so the dump capacitor 25 discharges across it. Immediately prior to the comparator 30 changing from the first to the second state, the integrating capacitor 26 is charged to a voltage that is at or near the voltage of $V_{ref1}$ and the dump capacitor 25 is fully discharged. The first comparator state persists until the next leading clock edge after $V_{int}$ first exceeds $V_{ref1}$.

The second comparator state is depicted in FIG. 3B, and is entered on the next clock edge after the voltage $V_{int}$ at integration node crosses (exceeds) the first reference voltage $V_{ref1}$ in the comparator 30. In the second state, the first switch 24 is closed and the second switch 27 is open. The injection FET 20 conducts to transfer a discrete and precise amount of charge, controlled by the value of the second reference voltage $V_{ref2}$, from the integrating capacitor 26 to the dump capacitor 25 without requiring a virtual ground node. In prior art op-amp integrators, an inverting input serves as a virtual ground. The injection FET 20 acts as a current source to the integrating capacitor 26, but as a voltage source to the dump capacitor 25 without taking any current from the second reference voltage $V_{ref2}$. The current needed to charge the dump capacitor 25 comes from the integrating capacitor 26, effectively subtracting it from the current at the input node 8. Since the injection FET 20 remains in saturation at all times that the first switch 24 is closed, the current in the drain 23 does not depend on the value of the drain voltage $V_{int}$. Likewise, since the input signal (at the input node 8) may be considered a current source, its value does not depend on voltage $V_{int}$ at the integration node 28. The integration node 28 therefore acts as a current summing junction, eliminating the need for an amplifier.

The effect of the charge dump from the integrating capacitor 26 to the dump capacitor 25 is the same as the effect of subtracting a current proportional to the output digital word (at 32) from the input current (at node 8) prior to the integration, differing only in that the charge is taken at discrete intervals defined by the clock 33 instead of being continuously drained away. Since the integration node 28 stays between well-defined limits, the average value of the charge transfer events must be precisely equal to the average value of the input current, and the output digital word is a precise representation of the input current. The value of the current (Iint) at the integration node 28 can therefore be reconstructed from the digital data word using the following equation:

$$I_{int} = F_{clk} * C_{dump} * (V_{ref2} + V_{offset}) * N_{hi} / (N_{hi} + N_{lo});$$  Eq. 1 where the values of $C_{dump}$ and $V_{offset}$ are found during calibration, $F_{clk}$ represents the clock frequency, $N_{hi}$ represents the number of times that $V_{int}$ was greater than $V_{ref1}$ since a last query, and $N_{lo}$ represents the number of times that $V_{int}$ was lower than $V_{ref1}$ since the last query. The need for two counters is avoided by restricting comparator state changes to only once per clock period, so that $(N_{hi}+N_{lo})$ is always equal to the number of clocks since the last query. In the circuit 10, the system doing the querying is also providing the clocks. The values for $N_{hi}$ and $N_{lo}$ can be readily recovered from the counter 40.

It is an important aspect of the invention that a minimum voltage $V_{int}(min)$ at the integration node 28 remains greater than a maximum voltage $V_{dump}(max)$ at the dump capacitor, preferably by at least the saturation voltage at the drain $V_{dsat}$ of the injection FET. This is accomplished in the circuit 10 by selecting capacitors 25, 26 such that the minimum voltage $V_{int}(min)$ at the integration node 28 stays above the gate voltage $V_{ref2}$. If, at any time, $V_{ref2}$ should exceed $V_{int}$ by more than a MOS threshold voltage, or equivalently, if $V_{int}$ should fall below $V_{dump}+V_{dsat}$, the injection FET 20 will act as a switch rather than a regulator of the dump capacitor 25 and the charge transferred would be proportional to the value of $V_{int}$ rather than to $V_{ref2}$. In a preferred embodiment, the circuit 10 operates in a 5-volt system, $V_{ref1}$ is 3.3 volts, and $V_{ref2}$ is 2.5 volts. The values of capacitor 26 and capacitor 25 are chosen such that the voltage at the integration node $V_{int}$ does not fall below 2.5 volts ($V_{ref2}$).

The ADC circuit 10 is a true low power circuit. Prior attempts to minimize the power consumption of op-amps have relied on circuit design for enhancing the amplifier, relaxed system specifications, or relegating the ADC to use in column circuitry to achieve the design goals. These prior attempts have not succeeded in lowering the power consumption enough to enable placing the ADC in each pixel cell. The present circuit exhibits low quiescent power by eliminating the op-amp and using an injection FET 20 that uses no power. Eliminating the amplifier eliminates attendant concerns such as amplifier power, finite gain, bandwidth limits, and noise. The inventive ADC 10 can be applied to high dynamic range input circuits while requiring little DC power. As an example of relative performance, calculations for input circuits scaled to a 256 by 256 array using a residue-readout type ADC predict input current to be between about 500 mW to about 1,000 mW, depending on the scenario. The same calculations predict input current for circuits 10 according to the present invention in the same array to range between about 100 mW to about 150 mW.

The ADC circuit 10 integrates a precise amount of charge by a novel use of an injection FET 20. Since charging of the dump capacitor 25 ends with the gate 21 being nearly off, it contributes very little noise to the charge dump value. In operation, the voltage waveform at node 22 always reaches a fixed value before being cut off. This reflects the amount of charge dumped in each cycle. Furthermore, using an injection gate 21 tied to a reference voltage $V_{ref2}$ to accomplish the charge dump isolates comparator errors from the conversion accuracy. Other embodiments of the circuit 10 may employ a bipolar transistor (such as where a MOSFET or JFET is not available) or other suitable substitute in place of the injection FET 20.

Operation of the circuit 10 as a folding ADC or as a delta-sigma ADC depends on operation of the controls. The same circuit architecture operates as a folding ADC if the integration is reset whenever the data is read out, and as a Delta-Sigma ADC if it is left to run continuously. Further, both capacitors 25, 26 may be comparable in value, as opposed to the Residue-readout design in which the dump capacitor is considerably smaller than the integration capacitor. However, the charge dump capacitor 25 of the inventive circuit 10 does not need to be linear.

Figure 4:
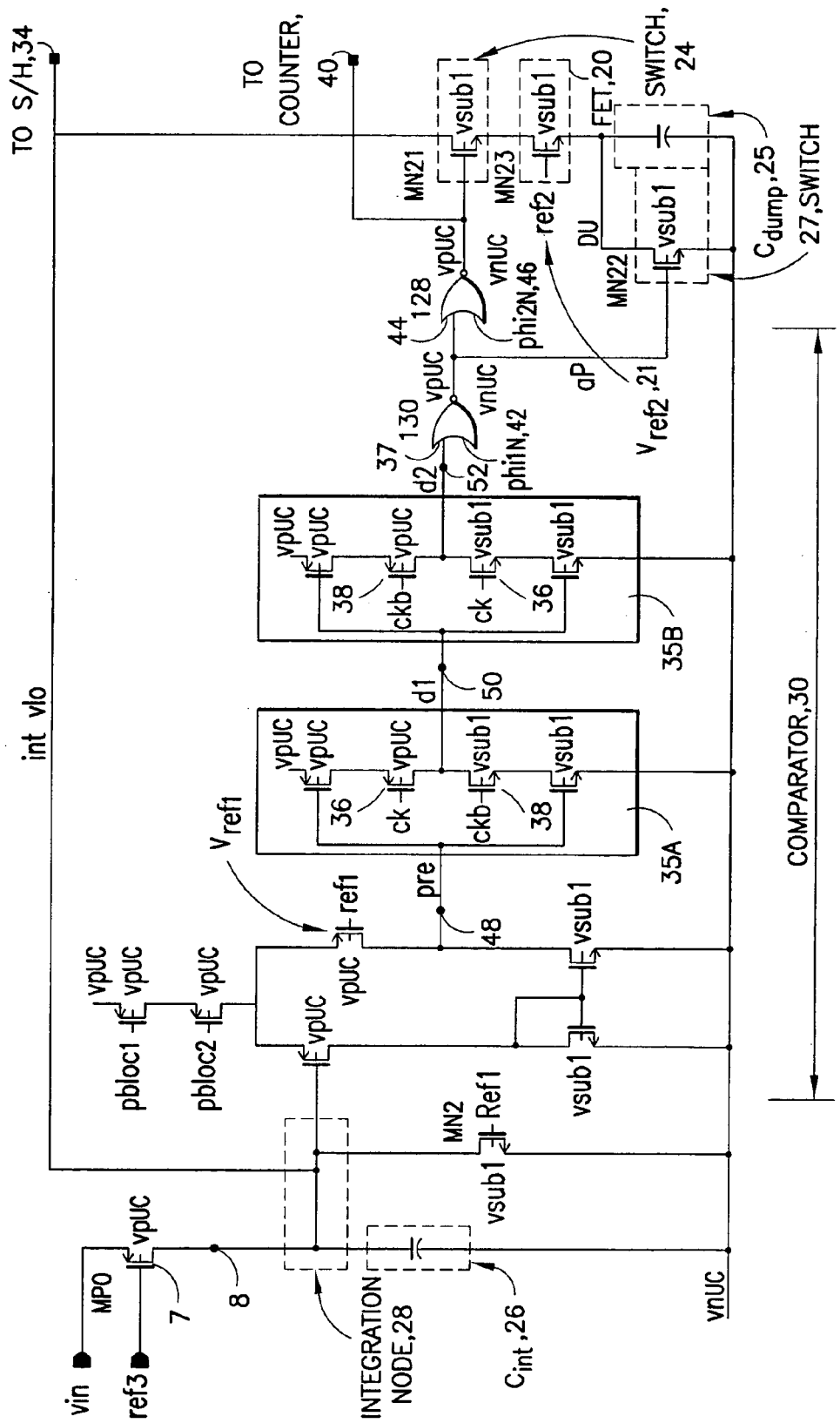
FIG. 4 depicts a logic diagram of the delta-sigma ADC of FIGS. 3A–B.

FIG. 4 is a circuit diagram of the delta-sigma ADC 10 in accordance with the teachings herein, and substantially mirrors the block diagram of FIGS. 3A–B. An input current $I_{in}$ passes through a FET 7 or other protection component to the input node 8 and the integration node 28. The integration capacitor $C_{int}$ 26, the comparator 30, and the first switch 24 are each independently coupled to the integration node 28. A lead for connecting a residue readout 34 such as a sample and hold circuit is also shown extending from the circuit line coupling the integration node 28 and the first switch 24. The first reference voltage $V_{ref1}$ is applied to an input of the comparator 30 as shown, and the second reference voltage $V_{ref2}$ is applied to the gate 21 of the injection FET 20 that is disposed between the first switch 24 and the dump capacitor $C_{dump}$ 25. An input to a counter 40 may be taken from the control of the first switch 24, or alternatively from the second switch 27 or directly from the comparator 30.

Within the comparator 30 are two tristate inverters 35A, 35B in series with one another that together form a dynamic D-type master-slave flip flop. The flip-flop delays the decision of the comparator (as to what state it's output 32 indicates) to synchronize with the clock, making the entire delta-sigma ADC 10 a synchronous discrete time system. Specifically, the arrangement shown in FIG. 4 synchronizes state changes of the comparator with low-to-high transitions of the clock. Each inverter comprises four transistors, two of which are controlled by opposing first 36 and second 38 clock pulses, which are opposite phases of the same clock signal. In other words, when one is high, the other is low, and the transitions are synchronous.

The flip-flop 35A, 35B operates as follows. When the first clock signal 36 is low, the second clock signal 38 is high by design. The input 48 to the first inverter 35A is inverted and output to the intermediate node 50. At this juncture, the output of the first inverter 35A (at node 50) is locked out of the second inverter 35B, which continues to hold its previous value at its output 52 due to parasitic capacitance. When the clock changes state so that the first clock signal 36 is high and the second clock signal 38 is low, the input 48 is locked out from the first inverter 35A, but the voltage at the intermediate node 50 remains due to parasitic capacitance there. The voltage at the intermediate node 50 enters the second inverter 35B, where it is inverted and output 52. The net result is that the pair of inverters 35A, 35B output 50 the value at the input 48 once per clock period. The flip-flop 35A, 35B functions reliably so long as the clock period is sufficiently short so that the voltages on the parasitic capacitances noted above do not drain away.

Two further clock signals are depicted in the system, also derived from the same master clock used to generate the comparator clock 33 but arranged so that they do not have overlapping low states. A first NOR gate 37 has as inputs the output of the flip-flop 35A, 35B and a third clock signal 42, and a second NOR gate 44 has as inputs the output of the first NOR gate 37 and a fourth clock signal 46. The output of the first NOR gate 37 controls the second switch 27 that is disposed between the FET 20 and the dump capacitor 25. The output of the second NOR gate 44 controls the first switch 24 that is disposed between the integration node 28 and the FET 20.

Figure 5:
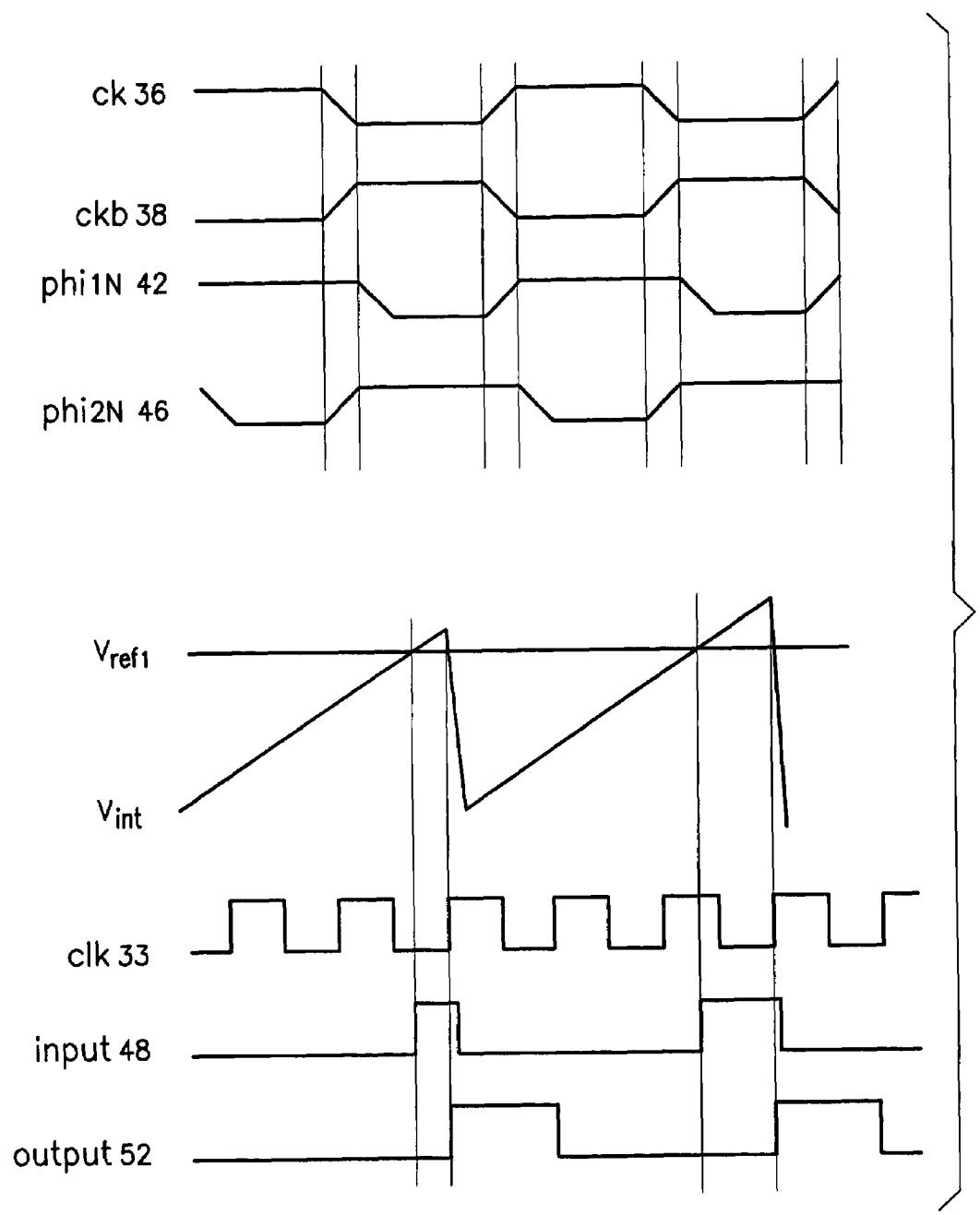
FIG. 5 is a series of timing diagrams relevant to the logic circuit of FIG. 4; and, FIG. 6 depicts a device that makes use of a low power delta-sigma ADC.

FIG. 5 illustrates timing relationships between the various clocks described above and the voltage at the integration node 28. The two topmost clock signals represent the first 36 and second 38 clock signals in the inverters 35A–B that define opposite phases of the same signal. The following two clock signals represent the third 42 and fourth 46 clock signals at the first 37 and second 44 NOR gates, respectively. The clock inputs 42, 46 to the NOR gates 37, 44 are not opposite in phase but are restricted in that they cannot both be low at the same time (they are non-overlapping). This ensures that the first 24 and second 27 switches operate opposite one another and are never closed at the same time. Dotted vertical lines aligned with the transitions of the first 36 and second 38 clock signals are provided to show the relationship with the third 44 and fourth 46 clock signals.

The lower portion of FIG. 5, depicting voltages for $v_{ref1}$ and $v_{int}$ (voltage at the integration node 28) and timing pulses for the clock 33 (input into the comparator 30), and the input 48 and output 52 of the combined inverters 35A–B, are not aligned with the four timing diagrams at the top of FIG. 5 and detailed above. The first through fourth clock signals 36, 38, 42, 46 all derive from the system clock signal 33. The voltage that is input 48 into the first inverter 35A changes from low to high when the voltage $V_{int}$ at the integration node 28 first exceeds the first reference voltage $V_{ref1}$. That input voltage 48 drops from high to low when the first reference voltage $V_{ref1}$ again exceeds the voltage $V_{int}$ at the integration node 28, evident in FIG. 5 in that the high-to-low transition of the input 48 is offset from the dotted vertical line associated with the peaks of $V_{int}$. Those peaks correspond to a low-to-high transition of the system clock 33. The peaks of $V_{int}$ also are aligned in time with the low-to-high transitions at the output 52 of the flip-flop 35A–B. Because the output 52 of the flip-flop 35A–B can change only once per clock cycle as noted above, the transition back to low is constrained, by the circuit described in conjunction with FIG. 4, only to the next low-to-high transition of the system clock 33. The pulses for the input 48 follow the instances wherein $V_{int}$-$V_{ref1}$ are positive, and the pulses for the output 52 follows the input 48 at the clock edge. It will be appreciated that various other timing diagrams will correspond to other circuitry that performs the functions of the block diagrams of FIG. 3 without departing from the broader teachings herein.

Figure 6:
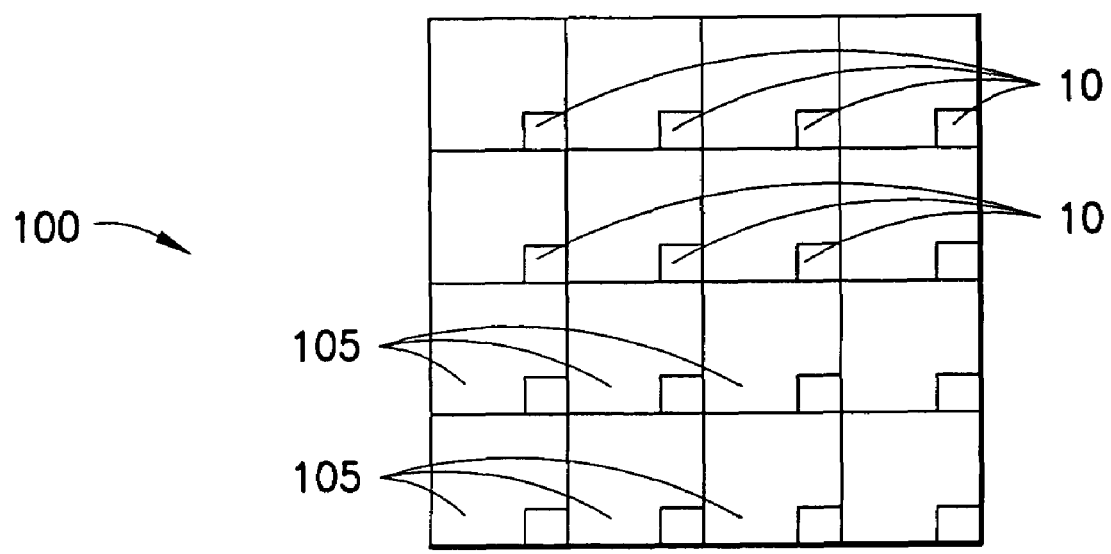

As noted above, one particularly advantageous disposition of a low power sigma-delta ADC 10 is in a focal plane array or other arrayed electronic device. An imaging array 100 of cells 105 as in FIG. 6, each including a low power delta-sigma ADC 10, should achieve essentially the same high dynamic range as the Residue-readout circuit but at a fifth the power.

In preferred embodiments, the low power delta-sigma ADC 10 resides behind each cell 105 in the array 100, and does not interfere with imaging. In one embodiment, each cell 105 is a radiation detector that provides a photocurrent to the circuit 10 by measuring incident radiation through generation currents induced in a semiconductor pn junction by the radiation. The inventors presently view the inventive ADC 10 as best suited to photodetector arrays. Radiation apart from infrared, such as visible, ultraviolet, or gamma radiation, may also be detected by various embodiments of radiation sensitive detectors. An array of radiation detectors 105 may be disposed on a single chip such as a mercury/cadmium/telluride or zinc/telluride based integrated circuit. A companion array of ADCs 10 according to the present invention may be disposed on another chip such as a silicon-based integrated circuit. The two disparate chips may then be disposed so that complementary electrical connections, such as indium bumps, are in contact with one another and each radiation detector 105 is electrically coupled to an ADC 10 that is constructed and operated in accordance with this invention. An analog signal generated by the individual detectors 105 is converted to digital by the delta-sigma ADC 10 associated with that detector 105. The resulting plurality of parallel digital signals is then further processed to transform the parallel digital signals to a coherent image. However, certain embodiments may dispose the array of readout ADC circuits and the array of radiation detectors on the same substrate.

Further specific uses for the ADC 10 and variations of the circuit described herein may become obvious to those skilled in the art without departing from the teachings herein. The ensuing claims are intended to be broad in scope to include all of these teachings, obvious variants of these teachings, and equivalents to these teachings.

What is claimed is:

1. A circuit comprising:
   an integration capacitor coupled to an integration node;
   a comparator having a first input coupled to the integration node and a second input coupled to a first reference voltage $V_{ref1}$;
   a dump capacitor having a first node and a second node;
   a transistor having a first node coupled through a first switch to said integration node, said transistor having an opposed second node coupled to said first node of the dump capacitor and a third node coupled to a second reference voltage $V_{ref2}$; and
   a second switch disposed across the dump capacitor;
   where open and closed states of said first and second switches are controlled by an output of the comparator.

2. The circuit of claim 1 wherein said comparator operates to maintain the first switch open and the second switch closed when in a first comparator state, and further operates to maintain the first switch closed and the second switch open when in a second comparator state.

3. The circuit of claim 1 wherein the transistor comprises a field effect transistor FET.

4. The circuit of claim 3 wherein the FET first node comprises a drain, the FET second node comprises a source, and the third node comprises a gate.

5. The circuit of claim 1 wherein said integration node and said integration capacitor are coupled to a radiation detector.

6. The circuit of claim 5 wherein said radiation detector operates as a current source to said circuit.

7. The circuit of claim 1 wherein a voltage $V_{int}$ at the integration node is never less than the second reference voltage $V_{ref2}$.

8. The circuit of claim 1 wherein the comparator is restricted to changing states only on a clock edge.

9. The circuit of claim 8 further comprising a counter coupled to an output of the comparator.

10. The circuit of claim 1 further comprising a residue readout coupled to the integration node.

11. A readout circuit comprising:
    an input node for receiving a signal from a radiation detector;
    an integrating capacitor having a first node coupled to the input node;
    a comparator having a first input coupled to said integrating capacitor first node and a second input coupled to a first reference signal;
    an injection field effect transistor FET having a gate coupled to a second reference signal, said FET coupled between said integrating capacitor first node and a node of a dump capacitor;
    a first switch disposed between the injection FET and the integrating capacitor first node; and
    a second switch across said dump capacitor;
    wherein an output of said comparator is coupled to said first and second switches for operating said switches in opposition to one another.

12. The readout circuit of claim 11 in combination with a radiation sensor having an output coupled to the input node.

13. A plurality of n readout circuits of claim 11 disposed on a first substrate in combination with a plurality of radiation sensors disposed on a second substrate, said first and second substrate in fixed relation to one another and coupled such that the input node of each of the n readout circuits is coupled to an output of a radiation sensor.

* * * * *